United States Patent
Akulova et al.

(10) Patent No.: US 6,771,869 B2
(45) Date of Patent: Aug. 3, 2004

(54) OPTOELECTRONIC DEVICE HAVING A BARRIER LAYER ASSOCIATED THEREWITH AND A METHOD OF MANUFACTURE THEREOF

(75) Inventors: Yuliya A. Akulova, Goleta, CA (US); Kenneth G. Glogovsky, Kempton, PA (US); Mark S. Hybertsen, West Orange, NJ (US); Charles W. Lentz, Reading, PA (US); Abdallah Ougazzaden, Breinigsville, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 40 days.

(21) Appl. No.: 10/125,169

(22) Filed: Apr. 18, 2002

(65) Prior Publication Data

US 2003/0198451 A1 Oct. 23, 2003

(51) Int. Cl.[7] .............................. G02B 6/26; G02B 6/10
(52) U.S. Cl. ........................ 385/131; 385/31; 385/129
(58) Field of Search ........................... 385/15, 129, 131

(56) References Cited

U.S. PATENT DOCUMENTS

| 5,721,750 A | * | 2/1998 | Kwon et al. ................ 372/44 |
| 5,863,809 A | * | 1/1999 | Koren ......................... 438/22 |
| 6,064,783 A | * | 5/2000 | Congdon et al. ........... 385/15 |
| 6,555,457 B1 | * | 4/2003 | Derkits et al. ............. 438/597 |

\* cited by examiner

*Primary Examiner*—John D. Lee
*Assistant Examiner*—Tina M. Lin
(74) *Attorney, Agent, or Firm*—Hitt Gaines, PC

(57) ABSTRACT

The present invention provides an optoelectronic device, a method of manufacture thereof, and an optical communication system including the same. The optoelectronic device may include, in one particular embodiment, an active device located over a substrate and a passive device located proximate the active device and over the substrate. The optoelectronic device may further include a doped cladding layer located over the active and passive devices and a barrier layer located over the doped cladding layer and the passive device.

17 Claims, 8 Drawing Sheets

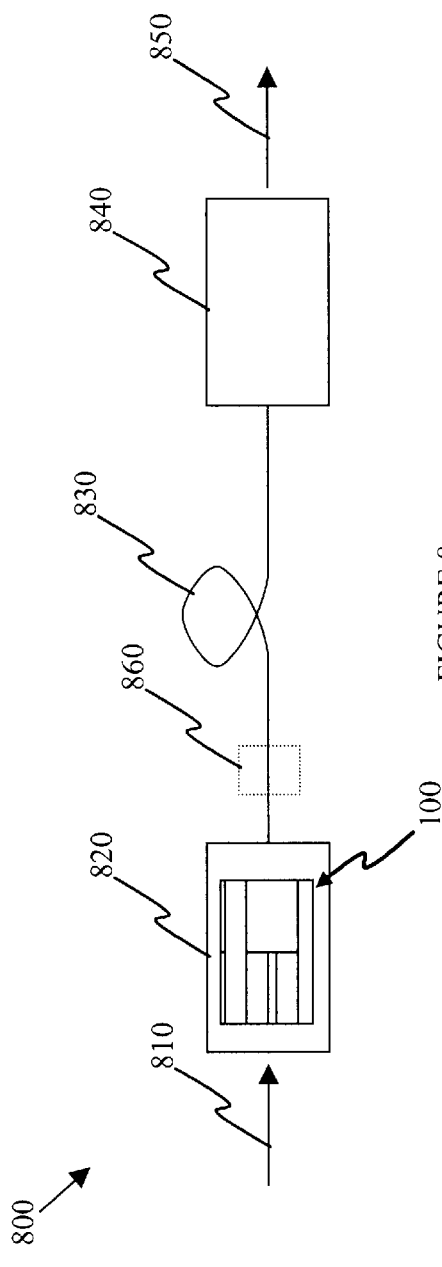
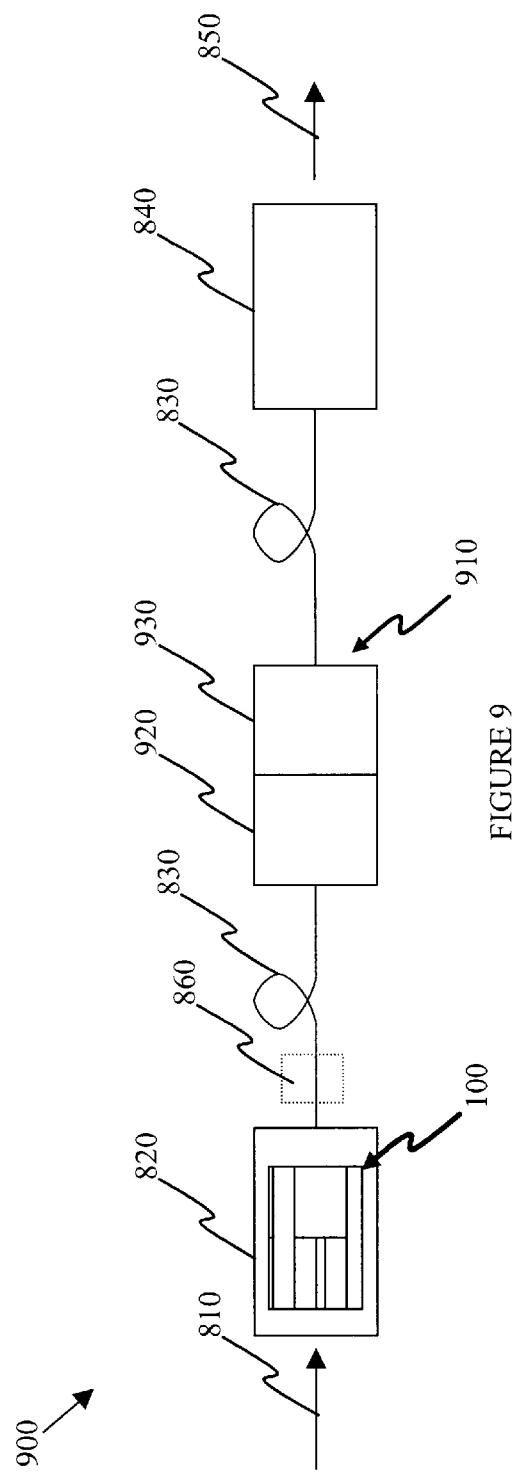

OPTOELECTRONIC DEVICE HAVING A BARRIER LAYER ASSOCIATED THEREWITH AND A METHOD OF MANUFACTURE THEREOF

TECHNICAL FIELD OF THE INVENTION

The present invention is directed, in general, to an optoelectronic device and, more specifically, to an optoelectronic device having a barrier layer associated therewith and a method of manufacture thereof.

BACKGROUND OF THE INVENTION

Optoelectronic industries, in general, have traditionally focused on hybrid integration of optoelectronic devices. For example, in many traditional optoelectronic systems, multiple optoelectronic devices are manufactured on individual optoelectronic substrates, all of which are subsequently connected by optical fibers. In many of those optoelectronic systems, it is common for a number of active devices, such as lasers, modulators, amplifiers, etc., to be optically coupled to various other passive devices, such as beam expanders and optical splitters, through the use of the previously mentioned optical fibers.

While hybrid integration of the active and passive devices was sufficient for many of the traditional telecommunication devices, present day telecommunication devices are not so forgiving. For example, telecommunication devices which employ hybrid integration are presently unable to reliably provide the increased bandwidth required in today's ultra-competitive markets. Specifically, hybrid integration may experience poor optical coupling between the optical devices and the optical fiber, poor mechanical stability of the circuit, high cost, and low performance.

In an attempt to avoid some of the problems associated with hybrid integration, the current trend in the optoelectronic industry is to manufacture multiple optical devices on a single optical substrate. Manufacturing multiple optical devices on a single optical substrate, or so-called monolithic integration, is one solution to the problems discussed above. Unfortunately, however, monolithic integration has its own problems.

For example, in the monolithic integration of an active device and a passive device, an indium phosphide (InP) layer is required over both devices. In the passive region, the indium phosphide (InP) layer helps confine the mode of the passive region. In the active region, the indium phosphide (InP) layer forms the P of the PIN structure. This occurs, however, only if the indium phosphide (InP) layer is doped with a P-type dopant, such as zinc.

A problem arises in that the P-type dopant is located in the entire indium phosphide (InP) layer, including over the passive region. It has been observed, in the past, that if the P-type dopant is located in the indium phosphide (InP) layer over the passive region, the passive region experiences high amounts of optical loss caused by carrier absorption.

The optoelectronic industry has attempted to curtail the carrier absorption in the passive region by implanting atomic hydrogen, or an isotope thereof, within the region of indium phosphide (InP) layer located over the passive region. Unfortunately, however, the hydrogen is not thermally stable and starts diffusing out of the indium phosphide (InP) layer at high temperatures. It is presently a concern that this out diffusion may cause reliability issues in the device.

Accordingly, what is needed in the art is an optoelectronic device, and more specifically, a monolithically integrated optoelectronic device, that does not experience the problems set out above.

SUMMARY OF THE INVENTION

To address the above-discussed deficiencies of the prior art, the present invention provides an optoelectronic device, a method of manufacture thereof, and an optical communication system including the same. The optoelectronic device may include an active device located over a substrate and a passive device located proximate the active device and over the substrate. The optoelectronic device may further include a doped cladding layer located over the active and passive devices and a barrier layer located over the doped cladding layer and the passive device.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the electronic industry, various features may not be drawn to scale. In fact, the dimensions of the various features may be arbitrarily increased or reduced for clarity of discussion. Reference is now made to the following descriptions taken in conjunction with the accompanying drawings, in which:

FIG. 8 illustrates an optical fiber communication system, which may form one environment where an optoelectronic device similar to the completed optoelectronic device illustrated in FIG. 1, may be included; and FIG. 9 illustrates an alternative optical fiber communication system.

DETAILED DESCRIPTION

Figure 1:
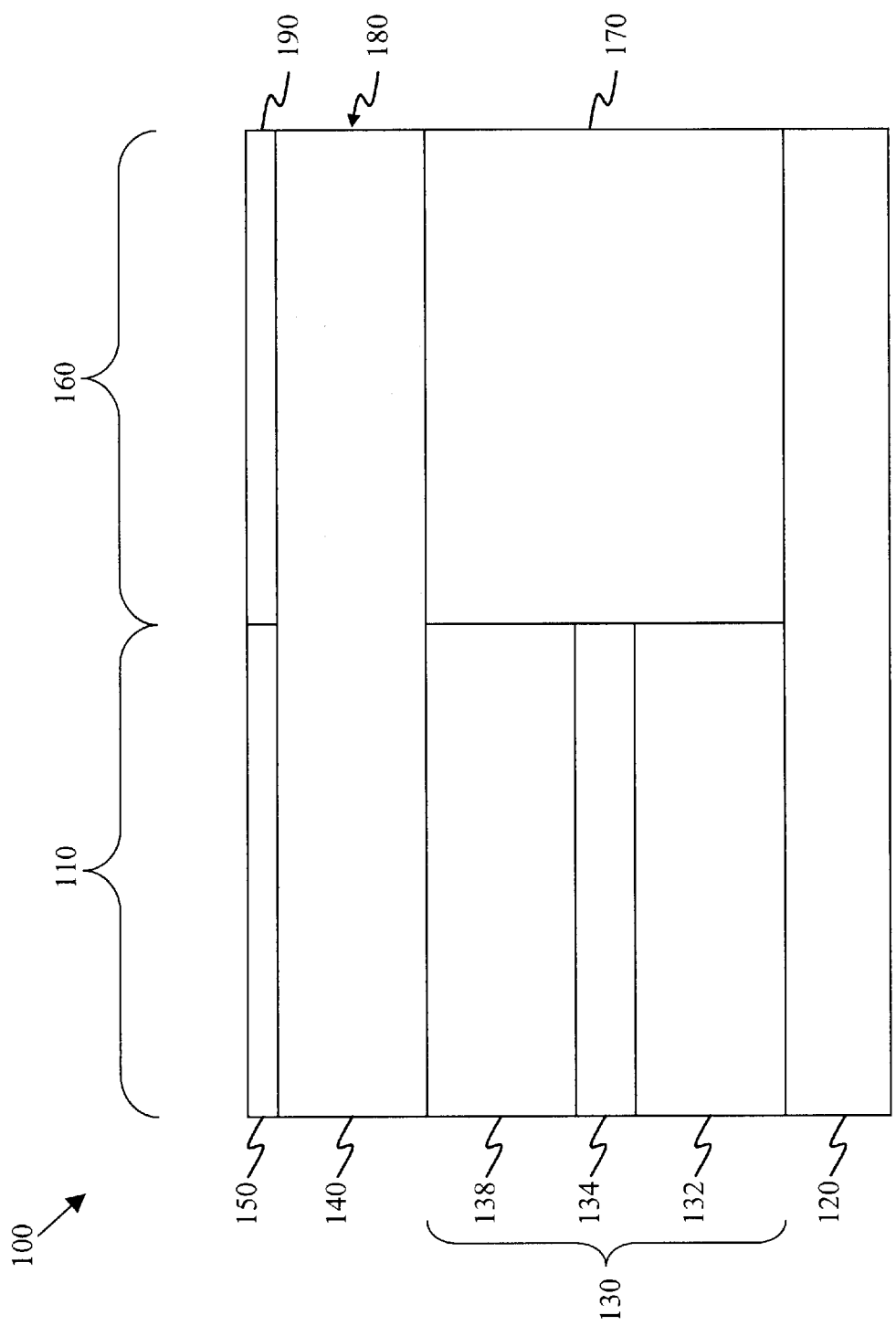
FIG. 1 illustrates a cross-sectional view of one embodiment of an optoelectronic device, as disclosed herein, and in accordance with the principles of the present invention.

Referring initially to FIG. 1, illustrated is a cross-sectional view of one embodiment of an optoelectronic device 100, as disclosed herein, and in accordance with the principles of the present invention. The present invention is broadly directed to an optoelectronic device 100 made of any material or compound that may have use in such devices. In the illustrative embodiments described herein, the optoelectronic device 100 is specifically discussed as a group III–V based device, for example an indium phosphide/indium gallium arsenide phosphide based device, a gallium arsenide based device, an aluminum gallium arsenide based device, or another group III–V based device. However, even though the present invention is discussed in the context of a group III–V based device, it should be understood that the present invention is not limited to group III–V compounds and that other compounds located outside groups III–V may be used.

In the illustrative embodiment shown, the optoelectronic device 100 includes an active region 110 and a passive region 160. As illustrated, both the active region 110 and passive region 160 are formed proximate one another and over a substrate 120. In an exemplary embodiment of the present invention, the active region 110 comprises an active device 130, such as a laser, modulator, amplifier, or another similar active device. While the active device 130 may comprise a variety of different active devices, for simplicity purposes, the active device 130 will hereafter be discussed in the context of an optical laser.

Accordingly, in the embodiment shown in FIG. 1, the active device 130 includes a first layer 132 formed over the substrate 120. The first layer 132, in the illustrative embodiment, is an N-type doped indium phosphide (InP) cladding layer. It should be understood that the first layer 132 is not limited to a N-type doped indium phosphide (InP) layer, and that other materials, doped or undoped, may be used.

As illustrated, an intrinsic layer 134 may be located over the substrate 120 and first layer 132. The intrinsic layer 134, as one skilled in the art readily recognizes, may be a quantum well region, and may, in an exemplary embodiment, include separate confining layers (not shown). In an exemplary embodiment of the invention, the intrinsic layer 134 includes materials chosen from group III–V compounds. The intrinsic layer 134 is typically intentionally not doped, however, in an alternative embodiment it may be doped as long as the p-n junction placement is taken into consideration.

The active device 130 shown, further includes a second layer 138 formed over the intrinsic layer 134. The second layer 138, in an exemplary embodiment, is an indium phosphide (InP) cladding layer having a dopant formed therein. The dopant is typically a P-type dopant such as zinc; however, one having skill in the art understands that other dopants, such as cadmium, beryllium and magnesium, may be used in this capacity.

The passive region 160, in contrast to the active region 110, may comprise a passive device 170. In an exemplary embodiment, the passive device 170 may comprise a beam expander, an optical splitter, an optical waveguide, or another similar passive device. For simplicity purposes, however, the passive device 170 will hereafter be discussed as an optical waveguide. Accordingly, in the particular embodiment shown, the passive device 170 may comprise a plurality of layers having various index of refractions, or another similar waveguide structure.

As illustrated, located over the active device 130 and passive device 170 is a doped cladding layer 140. The doped cladding layer 140 may comprise various materials and dopants. For example, in an exemplary embodiment, the doped cladding layer 140 is a P-type doped indium phosphide (InP) upper cladding layer. While zinc is one of the more common P-type dopants included within the doped cladding layer 140, other P-type dopants are within the purview of the present invention. Additionally, the doped cladding layer 140 may have numerous different dopant concentrations, including a preferred dopant concentration ranging from about 5E17 atoms/cm$^3$ to about 5E18 atoms/cm$^3$.

As shown in FIG. 1, an upper contact layer 150 may be positioned on one side of the active device 110. Generally, this upper contact layer 150 comprises indium gallium arsenide (InGaAs) and is doped with a similar dopant type as the doped cladding layer 140. For example, in the particular embodiment described above, the upper contact layer 150 could be P-type doped. Because a good ohmic contact is desired between the upper contact layer 150 and the doped cladding layer 140, the upper contact layer 150 is doped to a higher dopant concentration, ranging from about 1E19 atoms/cm$^3$ to about 5E19 atoms/cm$^3$.

In the illustrative embodiment shown in FIG. 1, a passivation material 180 is located within the doped cladding layer 140. In particular, the passivation material 180 is located within a portion of the doped cladding layer 140 located over the passive device 170. The passivation material 180, which may comprise hydrogen, may be included in the doped cladding layer 140 at a concentration ranging from about 5E17 atoms/cm$^3$ to about 5E18 atoms/cm$^3$. It should be noted that the term hydrogen, as used herein, includes hydrogen atoms and any isotopes thereof, as well as any compound arising from those atoms or isotopes. Accordingly, deuterium is also a preferred choice for the passivation material 180.

As illustrated, located over the doped cladding layer 140 and the passive device 170 is a barrier layer 190. The barrier layer 190, which may comprise indium phosphide (InP) or another similar material, may have a thickness that ranges from about 20 nm to about 100 nm. In an exemplary embodiment of the present invention, the barrier layer 190 thickness is about 30 nm. As illustrated, the barrier layer 190 may terminate at a perimeter of the passive region 160.

Additionally, the barrier layer 190 may be a doped barrier layer. Accordingly, an N-type dopant, such as silicon, is very beneficial if included within the barrier layer 190. This is particularly the case when the doped cladding layer 140 is passivated with the passivation material 180. Because the barrier layer 190 and the passivation material 180 have opposing electron states, they will substantially repel each other. Thus, the barrier layer 190 is designed to substantially inhibit the amount of passivation material 180 that diffuses out of the doped cladding layer 140. Accordingly, the barrier layer 190 helps the optoelectronic device 100 not to experience many of the drawbacks of the prior devices.

Figure 2:
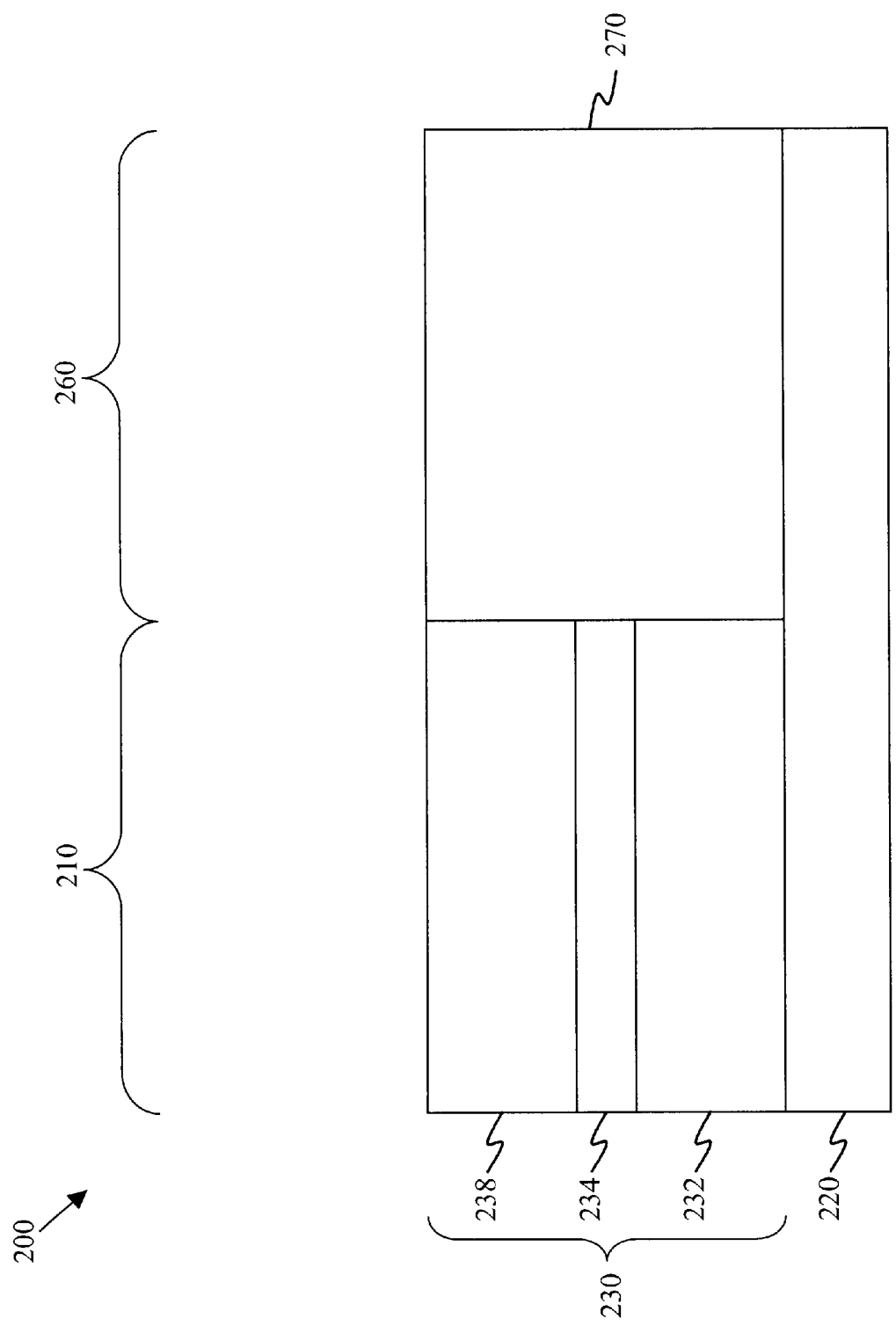
FIG. 2 illustrates a cross-sectional view of a partially completed optoelectronic device, in accordance with the principles of the present invention.

Turning to FIGS. 2–6, with continued reference to FIG. 1, illustrated are various intermediate stages of the manufacture of a device similar to the optoelectronic device 100 of FIG. 1. FIG. 2 illustrates a cross-sectional view of a partially completed optoelectronic device 200, in accordance with the principles of the present invention. In the illustrative embodiment shown, the optoelectronic device 200 includes an active region 210 and a passive region 260.

As recited above, the active region 210 will be described in the context of an active device 230, such as a laser, and the passive region 260 will be described in the context of a passive device 270, such as an optical waveguide. In the embodiment shown, the active device 230 is formed over a substrate 220. The substrate 220 may be any layer located in an optical device, including a layer located at the wafer level or a layer located above or below the wafer level. The substrate 220, in an exemplary embodiment, is a highly N-type doped indium phosphide (InP) substrate.

As is illustrated in FIG. 2, formed over the substrate 220, as part of the active device 230, may be a first layer 232. The first layer 232, in the illustrative embodiment, is an N-type doped indium phosphide (InP) cladding layer. It should be understood that the first layer 232 is not limited to a N-type doped indium phosphide (InP) layer, and that other materials, doped or undoped, may be used.

An intrinsic layer 234 may be located over the substrate 220 and first layer 232. The intrinsic layer 234, as one skilled in the art readily recognizes, may be a quantum well region, and may, in an exemplary embodiment, include separate confining layers (not shown). In an exemplary embodiment of the invention, the intrinsic layer 234 includes materials chosen from group III–V compounds. The intrinsic layer 234 is typically intentionally not doped, however, in an alternative embodiment it may be doped as long as the p-n junction placement is taken into consideration.

Further illustrated in FIG. 2, is a second layer 238 formed over the intrinsic layer 234. The second layer 238, in an exemplary embodiment, is an indium phosphide (InP) cladding layer having a dopant formed therein. The dopant is typically a P-type dopant such as zinc; however, one having skill in the art understands that other dopants, such as cadmium, beryllium and magnesium may be used in this capacity.

The substrate 220, first layer 232, intrinsic layer 234, and second layer 238 may all be formed using conventional deposition processes. For example, a metal organic vapor-phase epitaxy (MOVPE), molecular beam epitaxy (MBE), liquid phase epitaxy (LPE), or another similar epitaxial process may be used to form the various layers. In an exemplary embodiment, layers 232, 234, and 238 are all formed in the same process chamber. For example, in one advantageous embodiment, the partially completed optoelectronic device 200, including the substrate 220, may be placed within a MOCVD process chamber, wherein each of the remaining layers 232, 234 and 238 are formed. While a particular methodology of forming the active device 230 has been depicted, it should be noted that other methodologies for forming the active device 230 may be used without departing from the scope of the present invention.

Located proximate the active device 230 and over the substrate 220, is the passive device 270. As previously recited, the passive device 270 shown is an optical waveguide. For example, while not depicted in the drawing, the passive device 270 may comprise a plurality of layers have various index of refractions. Alternatively, the passive device 270 could include a taper. The idea of the taper is to smoothly decrease the value of the index of refraction of the intrinsic layer 234 to that of an optical fiber being coupled thereto. The smooth transition provides better coupling between the intrinsic region 234 and the optical fiber being coupled thereto. The passive device 270 may be manufactured using any conventional method.

Figure 3:
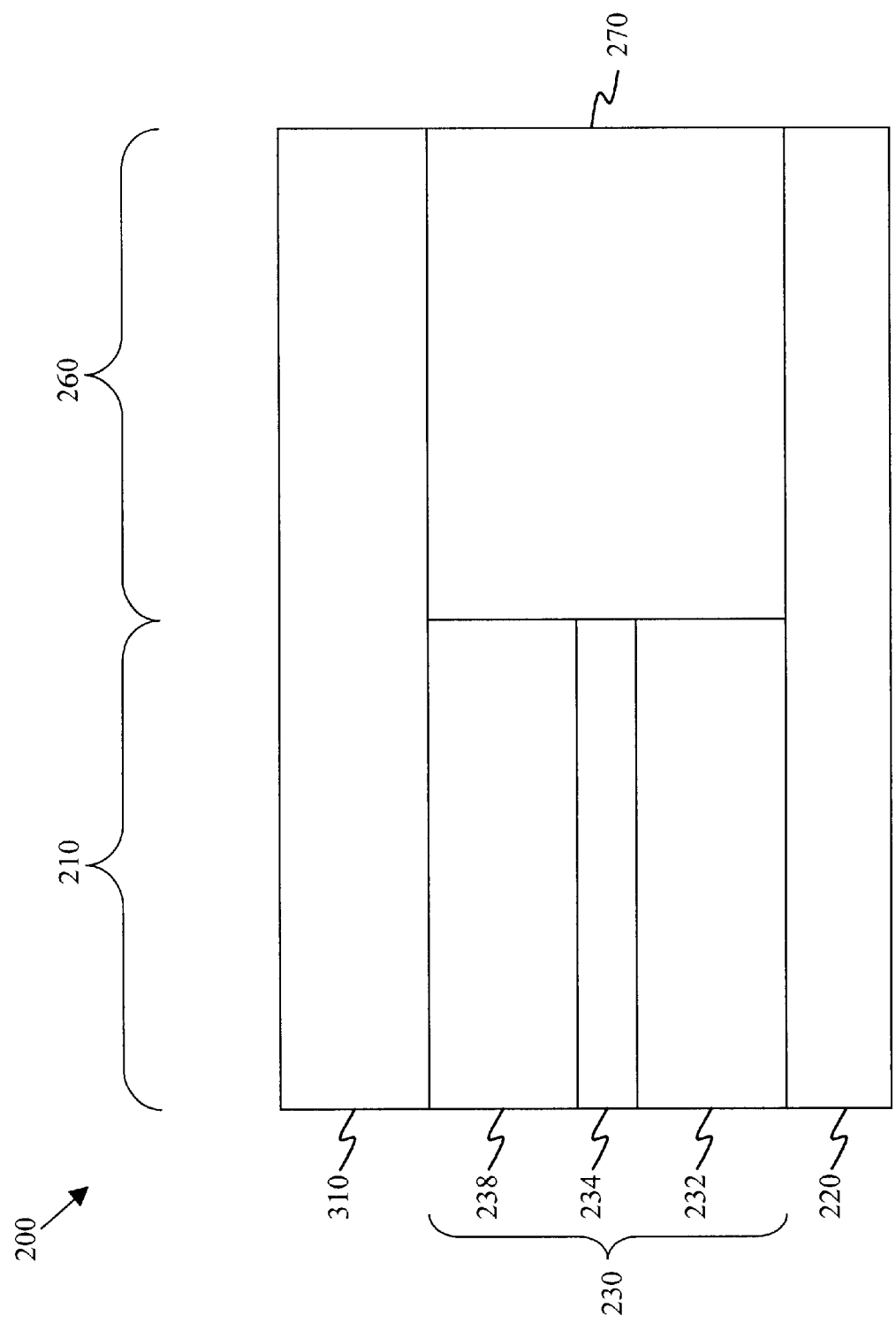
FIG. 3 illustrates the partially completed optoelectronic device illustrated in FIG. 2, after formation of a doped cladding layer.

Turning to FIG. 3, illustrated is the partially completed optoelectronic device 200 illustrated in FIG. 2, after formation of a doped cladding layer 310. As illustrated, the doped cladding layer 310 is formed over the active and passive devices 230, 270. The doped cladding layer 310, in an exemplary embodiment, is an indium phosphide (InP) cladding layer having a thickness ranging from about 1 $\mu$m to about 3 $\mu$m.

The dopant is typically a P-type dopant such as zinc; however, one having skill in the art understands that other dopants, such as cadmium, beryllium and magnesium may be used in this capacity. Further, the doped cladding layer 310 may have a dopant concentration ranging from about 5E17 atoms/cm$^3$ to about 5E18 atoms/cm$^3$, with a preferred value ranging from about 1E18 atoms/cm$^3$ to about 2E18 atoms/cm$^3$.

The doped cladding layer 310 may be formed using many conventional processes. For example, the doped cladding layer 310 may be formed using a similar process as used to form the active device 230, such as a conventional MOVPE or other similar process. Because the processes for forming the doped cladding layer 310 are so well known, no further discussion is required.

Figure 4:
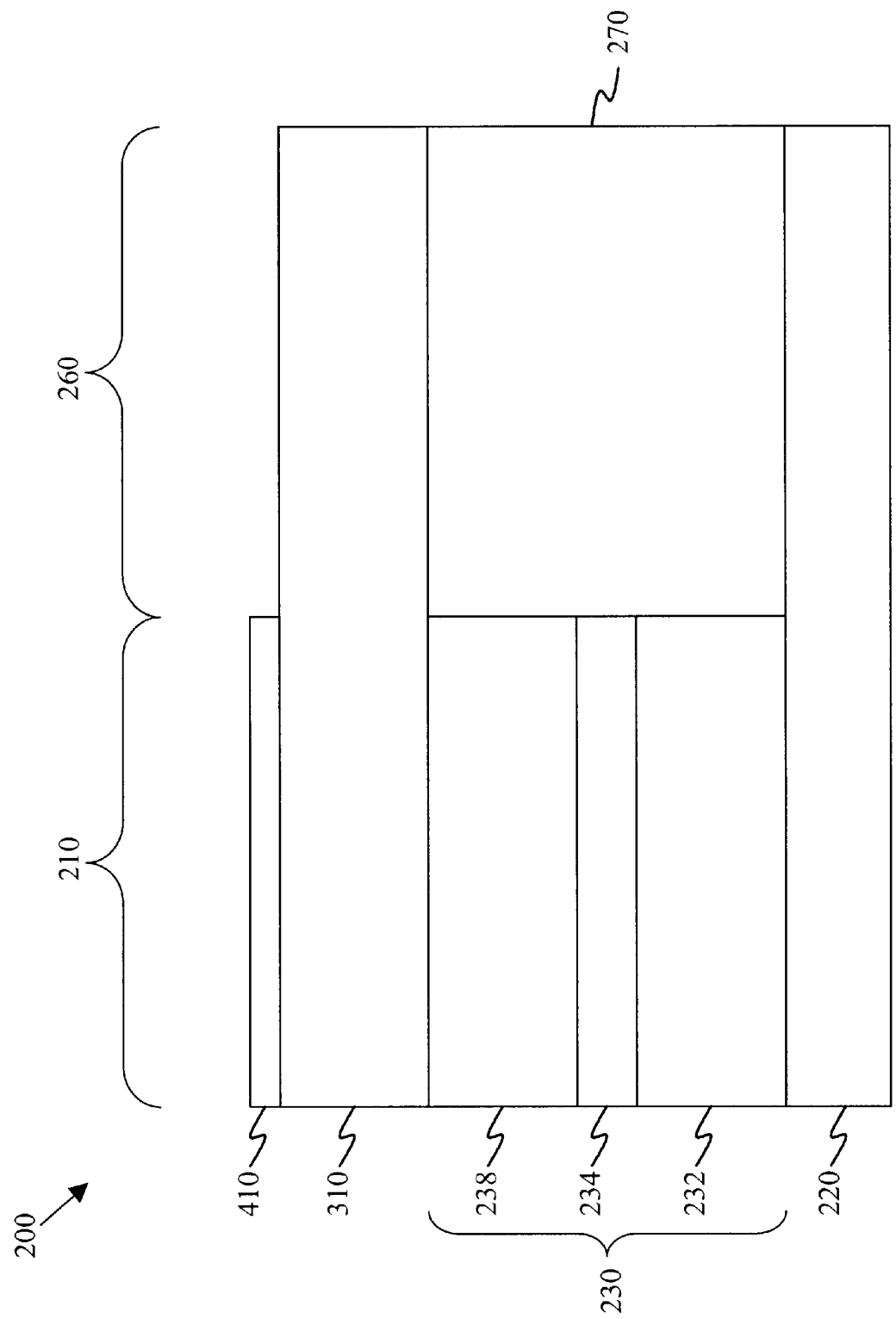
FIG. 4 illustrates the partially completed optoelectronic device illustrated in FIG. 3, after formation of an upper contact layer.

Turning now to FIG. 4, illustrated is the partially completed optoelectronic device 200 illustrated in FIG. 3, after formation of an upper contact layer 410. The upper contact layer 410 generally comprises a ternary compound, such as indium gallium arsenide (InGaAs) or another similar compound. Additionally, the upper contact layer 410 may be conventionally formed as blanket layers of indium gallium arsenide. The blanket layers of indium gallium arsenide may then be patterned, resulting in the upper contact layer 410 shown. In an exemplary embodiment of the invention, the upper contact layer 410 is formed in the same processing chamber as the doped cladding layer 310.

Figure 5:
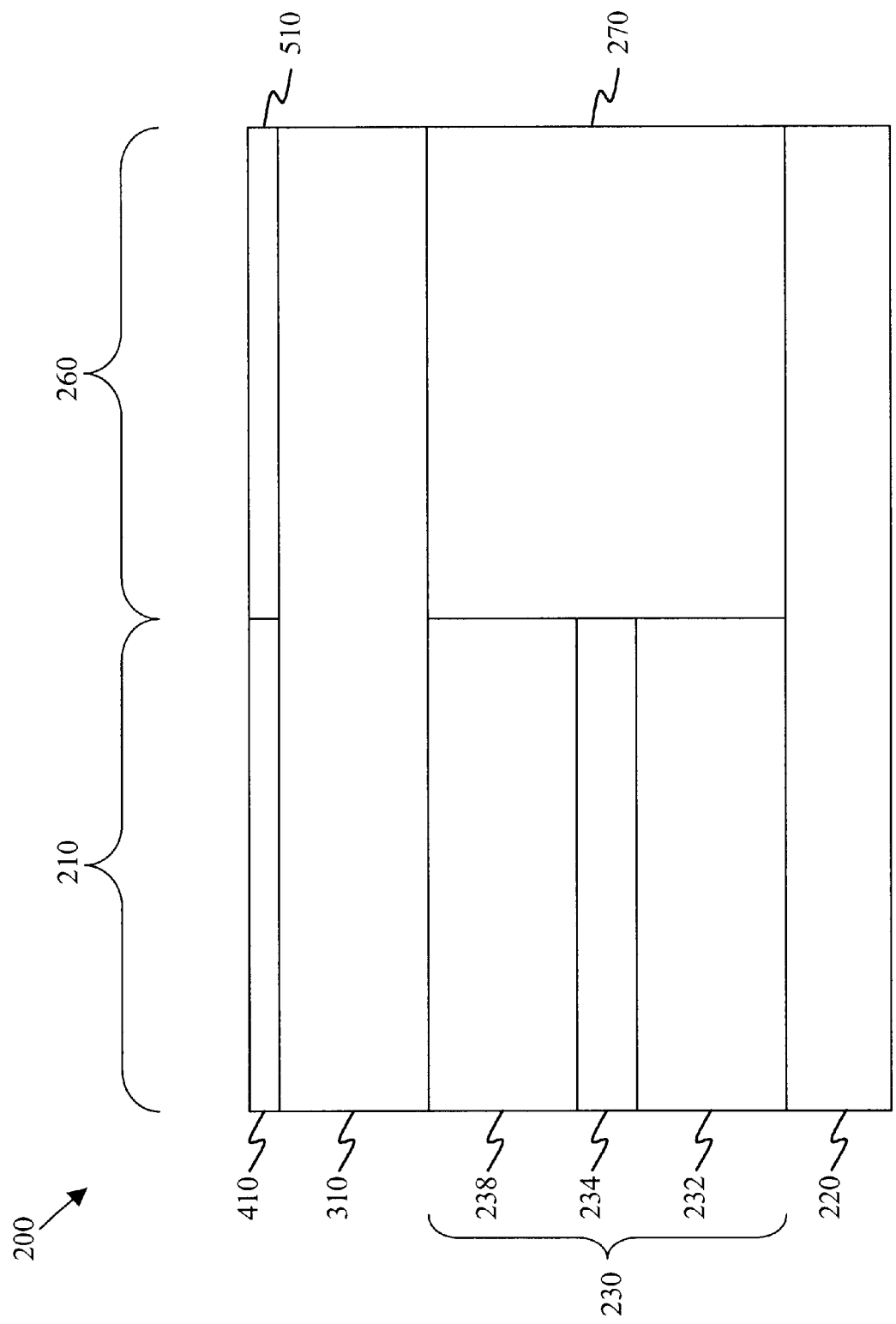
FIG. 5 illustrates the partially completed optoelectronic device illustrated in FIG. 4, after formation of a barrier layer over the doped cladding layer and the passive device.

Turning to FIG. 5, illustrated is the partially completed optoelectronic device 200 illustrated in FIG. 4, after formation of a barrier layer 510 over the doped cladding layer 310 and the passive device 270. The barrier layer 510 may comprise a host of different materials, however, in an exemplary embodiment of the present invention, the barrier layer 510 comprises doped indium phosphide (InP). In one embodiment, an N-type dopant is used to dope the barrier layer 510. Additionally, the barrier layer 510 may have a dopant concentration ranging from about 5E17 atoms/cm$^3$ to about 5E18 atoms/cm$^3$, with a preferred value ranging from about 1E18 atoms/cm$^3$ to about 2E18 atoms/cm$^3$.

The barrier layer may be formed to a thickness ranging from about 20 nm to about 100 nm, with a preferred range being from about 30 nm to about 50 nm. In the illustrative embodiment shown, the barrier layer 510 terminates at a perimeter of the passive device 270. Accordingly, in the embodiment shown, the barrier layer 510 is not located over any portion of the active device 230. While terminating the barrier layer 510 at a perimeter of the passive device 270 may be desired in certain circumstances, it should be noted that such a feature is not required.

One skilled in the art understands how to form the barrier layer 510. In one exemplary embodiment, however, the barrier layer 510 is formed using a MOVPE or MOCVD process. For example, a temperature ranging from about 600° C. to about 660° C., a pressure ranging from about atmospheric pressure to about 40 Torr, and a time of growth ranging from about 5 minutes to about 10 minutes are within the scope of the present invention. While certain specific parameters have been discussed, other applicable processing conditions should not be excluded.

Figure 6:
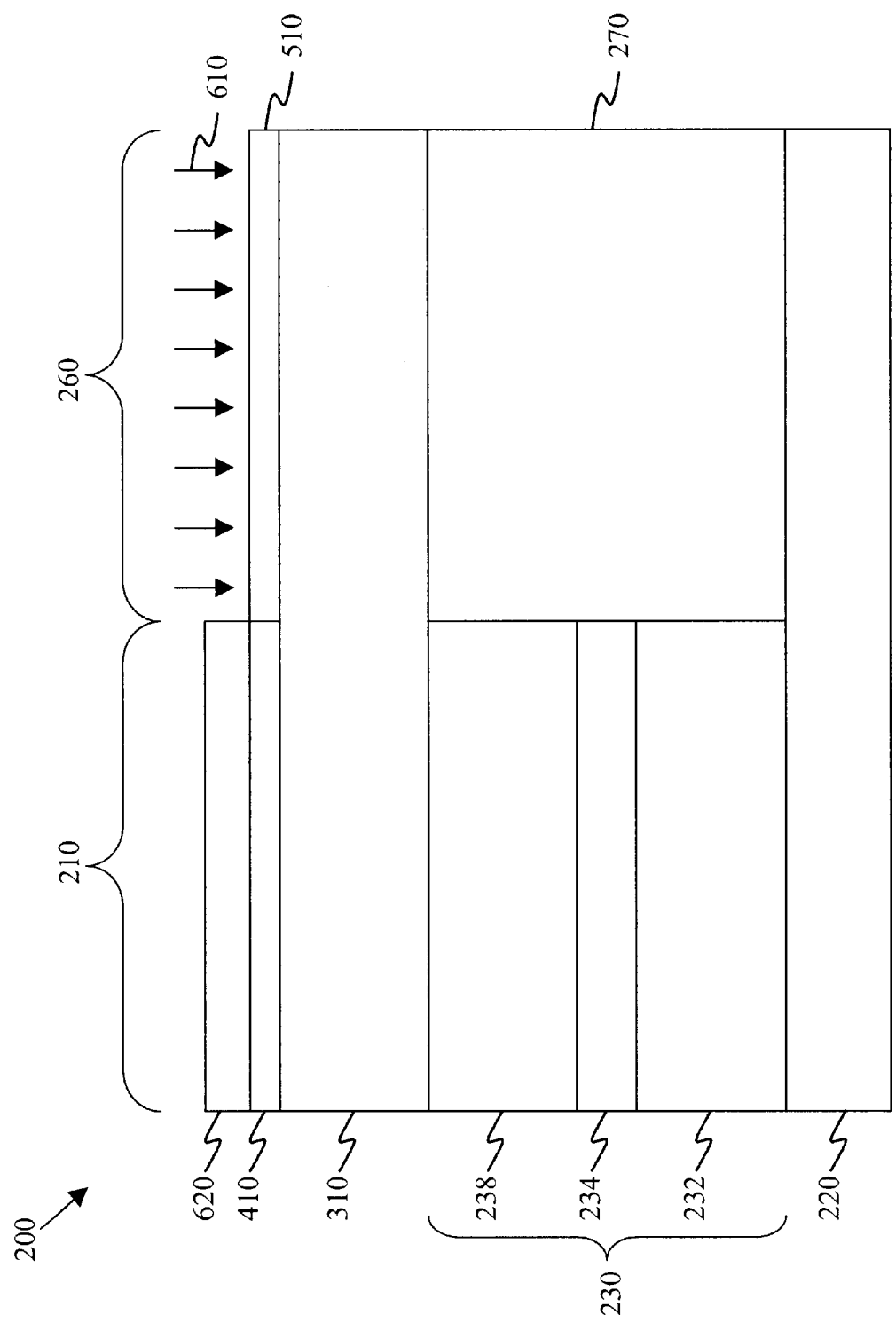
FIG. 6 illustrates the partially completed optoelectronic device illustrated in FIG. 5, after inclusion of a passivation material within the doped cladding layer.

Turning to FIG. 6, illustrated is the partially completed optoelectronic device 200 illustrated in FIG. 5, after inclusion of a passivation material 610 within the doped cladding layer 310. In the illustrative embodiment shown, the passivation material 610 comprises hydrogen having a dopant concentration ranging from about 5E17 atoms/cm$^3$ to about 5E18 atoms/cm$^3$. Alternatively, however, the dopant concentration may range from about 1E18 atoms/cm$^3$ to about 2E18 atoms/cm$^3$. Moreover, one aspect of the invention provides that the dopant concentration of the passivation material 610 in the doped cladding layer 310 be substantially similar to the dopant concentration of the P-type dopant in the doped cladding layer 310.

As illustrated, the passivation material 610 may be located within the doped cladding layer 310 over the passive device 270. A conventional mask 620 may be used for this placement. One skilled in the art understands how to place the passivation material 610 within the doped cladding layer 310. In one exemplary embodiment, however, a gas flow rate of 0.7 sccm of hydrogen and 70 sccm of helium, a pressure of about 90 mtorr, a temperature of about 200° C., and a power of about 35 Watts, may be used. Other processing conditions are, however, within the scope of the present invention.

In theory, the passivation material 610 substantially inhibits the dopant already located within the doped cladding layer 310 from diffusing into the passive device 270. A problem with prior devices was that the passivation material 610 would also move when subjected to temperatures above about 300° C. In such situations, the passivation material might then escape and have a negative effect on the completed optoelectronic device. A benefit of the optoelectronic device 200 illustrated in FIG. 6, is that the barrier layer 510 substantially inhibits the passivation material 610 from diffusing out of the doped cladding layer 310. As such, the optoelectronic device illustrated in FIG. 6 does not experience many of the drawbacks experienced by many of the devices currently used.

Figure 7:
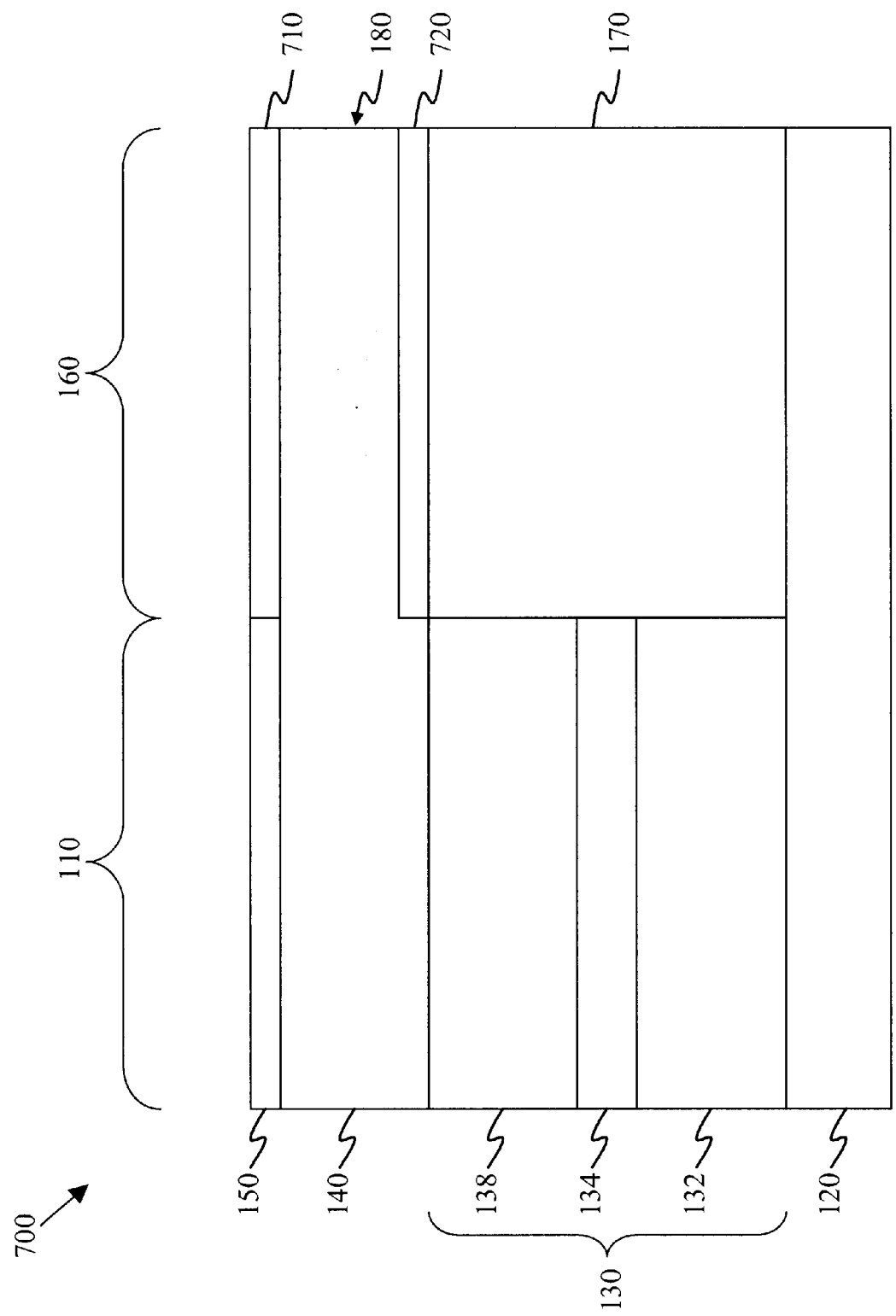
FIG. 7 illustrates an alternative embodiment of an optoelectronic device, in accordance with the principles of the present invention.

Turning briefly to FIG. 7, illustrated is an alternative embodiment of an optoelectronic device 700, in accordance with the principles of the present invention. The optoelectronic device 700 illustrated in FIG. 7 is similar to the optoelectronic device 100 shown in FIG. 1, however, the barrier layer 190 of FIG. 1 is now an upper barrier layer 710. Moreover, the optoelectronic device 100 further includes a lower barrier layer 720. As illustrated, the upper barrier layer 710 is located over and in contact with the doped cladding layer 180. As also illustrated, the lower barrier layer 720 is located over the passive device 170, but under and in contact with the doped cladding layer 180. Other configurations, neither shown nor discussed, are also within the broad scope of the present invention.

Turning briefly to FIG. 8, illustrated is an optical communication systems 800, which may form one environment where an optoelectronic device 805 similar to the completed optoelectronic device 100 illustrated in FIG. 1, may be included. The optical communication system 800, in the illustrative embodiment, includes an initial signal 810 entering a transmitter 820. The transmitter 820, receives the initial signal 810, addresses the signal 810 in whatever fashion desired, and sends the resulting information across an optical fiber 830 to a receiver 840. The receiver 840 receives the information from the optical fiber 830, addresses the information in whatever fashion desired, and provides an ultimate signal 850. As illustrated in FIG. 8, the completed optoelectronic device 805 may be included within the transmitter 820. However, the completed optoelectronic device 805 may also be included anywhere in the optical communication system 800, including the receiver 840. The optical communication system 800 is not limited to the devices previously mentioned. For example, the optical communication system 800 may include a source 860, such as a laser or a diode.

Turning briefly to FIG. 9, illustrated is an alternative optical communication system 900, having a repeater 910, including a second receiver 920 and a second transmitter 930, located between the transmitter 820 and the receiver 840.

Although the present invention has been described in detail, those skilled in the art should understand that they can make various changes, substitutions and alterations herein without departing from the spirit and scope of the invention in its broadest form.

What is claimed is:

1. An optoelectronic device, comprising:
   an active device located over a substrate;
   a passive device located proximate the active device and over the substrate;
   a doped cladding layer located over the active and passive devices;
   a barrier layer located over the doped cladding layer and the passive device; and
   a passivation material located within the doped cladding layer located over the passive device, wherein the barrier layer inhibits the amount of passivation material that diffuses out of the doped cladding layer.

2. The optoelectronic device as recited in claim 1, wherein the passivation material contains hydrogen having a concentration ranging from about 5E17 atoms/cm$^3$ to about 5E18 atoms/cm$^3$.

3. The optoelectronic device as recited in claim 1 wherein the doped cladding layer contains a first type dopant and the barrier layer contains a second type dopant.

4. The optoelectronic device as recited in claim 3 wherein the first type dopant is a P-type dopant and the second type dopant is an N-type dopant.

5. An optoelectronic device, comprising:
   an active device located over a substrate;
   a passive device located proximate the active device and over the substrate;
   a doped cladding layer located over the active and passive devices; and
   a barrier layer located over the doped cladding layer and the passive device, wherein the barrier layer has a thickness ranging from about 20 nm to about 100 nm.

6. The optoelectronic device as recited in claim 1 wherein the barrier layer terminates at a perimeter of the passive device.

7. The optoelectronic device as recited in claim 1 wherein the barrier layer is an upper barrier layer located over and in contact with the doped cladding layer, and further including a lower barrier layer located over the passive device, but under and in contact with the doped cladding layer.

8. The optoelectronic device as recited in claim 1 wherein the optoelectronic device is included within an optical communication system including a transmitter or a receiver.

9. A method of manufacturing an optoelectronic device, comprising:
   forming an active device over a substrate;
   forming a passive device proximate the active device and over the substrate;
   providing a doped cladding layer over the active and passive devices;
   creating a barrier layer over the doped cladding layer and passive device; and introducing a passivation material within the doped cladding layer located over the passive device, wherein the barrier layer inhibits the amount of passivation material that diffuses out of the doped cladding layer.

10. The method as recited in claim 9 wherein introducing a passivation material includes introducing a passivation material having a hydrogen concentration ranging from about 5E17 atoms/cm$^3$ to about 5E18 atoms/cm$^3$.

11. The method as recited in claim 9 wherein providing a doped cladding layer includes providing a doped cladding layer doped with a first type dopant and creating a barrier layer includes creating a barrier layer doped with a second type dopant.

12. The method as recited in claim 11 wherein the first type dopant is a P-type dopant and the second type dopant is an N-type dopant.

13. A method of manufacturing an optoelectronic device, comprising:
- forming as, active device over a substrate;
- forming a passive device proximate the active device and over the substrate;
- providing a doped cladding layer over the active and passive devices; and
- creating a barrier layer over the doped cladding layer and passive device, wherein creating a barrier layer includes creating a barrier layer having a thickness ranging from about 20 nm to about 100 nm.

14. The method as recited in claim 9 wherein creating a barrier layer includes creating a barrier layer that terminates at a perimeter of the passive device.

15. The method as recited in claim 9 wherein creating a barrier layer includes creating an upper barrier layer over and in contact with the doped cladding layer, and further including creating a lower barrier layer over the passive device, but under and in contact with the doped cladding layer.

16. An optical communication system, comprising:
- an optical fiber;
- a transmitter and a receiver connected by the optical fiber; and
- an optoelectronic device, including;
  - an active device located over a substrate;
  - a passive device located proximate the active device and over the substrate;
  - a doped cladding layer located over the active and passive devices;
  - a barrier layer located over the doped cladding layer and passive device; and a passivation material located within the doped cladding layer located over the passive device, wherein the barrier layer reduces the amount of passivation material that diffuses out of the doped cladding layer.

17. The optical fiber communication system recited in claim 16 wherein the transmitter or the receiver includes the optoelectronic device.

* * * * *